United States Patent
Darwish et al.

(10) Patent No.: US 6,603,188 B1
(45) Date of Patent: Aug. 5, 2003

(54) POLYSILICON-EDGE, LOW-POWER, HIGH-FREQUENCY BIPOLAR TRANSISTOR AND METHOD OF FORMING THE TRANSISTOR

(75) Inventors: Mohamed N. Darwish, Campbell, CA (US); Alexei Sadovnikov, Sunnyvale, CA (US); Reda Razouk, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/207,628

(22) Filed: Jul. 29, 2002

Related U.S. Application Data

(62) Division of application No. 09/882,600, filed on Jun. 15, 2001, now Pat. No. 6,475,848.

(51) Int. Cl.[7] .......................................... H01L 27/082
(52) U.S. Cl. ................................................... 257/565
(58) Field of Search .......................... 438/202, 204; 257/565, 574, 586, 588, 591, 592

(56) References Cited

U.S. PATENT DOCUMENTS

| | | | |
|---|---|---|---|
| 5,994,196 A | 11/1999 | Seog | 438/370 |
| 6,380,017 B1 | 4/2002 | Darwish et al. | 438/202 |
| 6,482,710 B2 * | 11/2002 | Oda et al. | 438/311 |
| 6,551,891 B1 * | 4/2003 | Chantre et al. | 438/343 |

OTHER PUBLICATIONS

Wilm van der Wel et al., "Pol y–Ridge Emitter Transistor (PRET): Simple Low–Power Option to a Bipolar Process", IEDM, 1993, pps. 453–456.

C.A. King et al., "Very Low Cost Graded SiGe Base Bipolar Transistors for a High Performance Modular BiCMOS Process", IEDM, 1999, pps. 565–568.

* cited by examiner

*Primary Examiner*—Caridad Everhart
(74) *Attorney, Agent, or Firm*—Mark C. Pickering

(57) ABSTRACT

A low-power high-frequency bipolar transistor is formed to have a small self-aligned base region that reduces the base-to-collector capacitance, and small self-aligned base and emitter contacts that reduce the base-to-emitter capacitance and the base resistance. The base and emitter contacts are formed to have sub-lithographic feature sizes.

2 Claims, 4 Drawing Sheets

POLYSILICON-EDGE, LOW-POWER, HIGH-FREQUENCY BIPOLAR TRANSISTOR AND METHOD OF FORMING THE TRANSISTOR

This is a divisional of application Ser. No. 09/882,600 filed Jun. 15, 2001 now U.S. Pat. No. 6,475,848.

BACKGROUND OF THE INVENTION

1. Field of the Invention

The present invention relates to a bipolar transistor and, more particularly, to a polysilicon-edge, low-power, high-frequency bipolar transistor and a method of forming the transistor.

2. Description of the Related Art

A high-frequency bipolar transistor is a device that can turn off and on again fast enough to respond to a high-frequency signal without distorting the wave shape of the signal. A low-power high-frequency bipolar transistor is a device that consumes very little power in responding to the high-frequency signal. Low-power high-frequency bipolar transistors are used in wireless applications, and are finding uses in emerging optical networking applications.

FIG. 1 shows a cross-sectional diagram that illustrates a portion of a prior-art, low-power high-frequency bipolar transistor 100. As shown in FIG. 1, transistor 100 includes a collector layer 110, a base layer 112 that is formed on collector-layer 110, and a field oxide region FOX that adjoins layer 112. In addition, transistor 100 includes a thin oxide layer 114 that is formed on a portion of base layer 112 and the field oxide region FOX, and a n+ extrinsic emitter 116 that is formed on thin oxide layer 114.

As further shown in FIG. 1, transistor 100 also includes an n+ emitter region 118 that is formed in base layer 112, and an n+ poly ridge 120 that is connected to extrinsic emitter 116 and n+ emitter region 118. Extrinsic emitter 116, emitter region 118, and poly ridge 120 form the emitter of the transistor.

Transistor 100 additionally includes a silicided base contact 122 that is formed on base layer 112, and a silicided emitter contact 124 that is formed on extrinsic emitter 116. In addition, an oxide spacer 126 is formed on base layer 112 between poly ridge 120 and base contact 122.

During fabrication, emitter region 118 is formed from dopants diffusing from poly ridge 120 into base layer 112. As a result, a very small base-to-emitter junction results. A small base-to-emitter junction reduces the base-to-emitter capacitance which, in turn, allows low-power high-frequency operation.

One drawback of transistor 100, however, is that transistor 100 has a large base-to-collector capacitance which, in turn, limits the operation of the transistor. Thus, there is a need for a low-power high-frequency bipolar transistor with a reduced base-to-emitter capacitance and base-to-collector capacitance.

SUMMARY OF THE INVENTION

The present invention provides a low-power high-frequency bipolar transistor that reduces the base resistance, the base-to-emitter capacitance, and the base-to-collector capacitance. Thus, the present invention provides the advantages of the prior-art transistor while reducing the high base-to-collector capacitance of the prior-art bipolar transistor.

The bipolar transistor of the present invention is formed on a wafer that has a buried layer and a first epitaxial layer of a first conductivity type. The first epitaxial layer is formed over the buried layer and has a smaller dopant concentration than the buried layer.

The bipolar transistor has an intrinsic base region of a second conductivity type that is formed on the first epitaxial layer. The intrinsic base region has a first side wall, a second side wall, and a top surface that is connected to the first side wall via a first notch and to the second side wall via a second notch.

The bipolar transistor also has a layer of isolation material that is formed on the first epitaxial layer. The layer of isolation material contacts the first side wall and the second side wall of the intrinsic base region, and is formed over the first notch and the second notch. In addition, the bipolar transistor includes an intrinsic emitter region that is formed in the intrinsic base region, an extrinsic base that is formed on the layer of isolation material, and an extrinsic emitter that is formed on the layer of isolation material.

The bipolar transistor further includes a conductive base spacer that is connected to the extrinsic base and the intrinsic base region, and a conductive emitter spacer that is connected to the extrinsic emitter and the intrinsic base region. The conductive base spacer is formed over the first notch, while the conductive emitter spacer is formed over the second notch.

The present invention also includes a method for forming a low-power high-frequency bipolar transistor. The bipolar transistor is formed on a wafer that has a buried layer and a first epitaxial layer of a first conductivity type. The first epitaxial layer is formed over the buried layer and has a smaller dopant concentration than the buried layer.

The method of the present invention begins by forming a layer of isolation material on the first epitaxial layer, and forming an extrinsic base and an extrinsic emitter on the layer of isolation material. The extrinsic base, which is spaced apart from the extrinsic emitter, has a second conductivity type while the extrinsic emitter has the first conductivity type.

The method also includes the step of etching the layer of isolation material to form an opening in the layer of isolation material. The opening is between the extrinsic base and the extrinsic emitter, and exposes a surface of the first epitaxial layer. The method further includes the steps of forming a first intrinsic base region on the first epitaxial layer in the first opening, and forming an isolation region on the first intrinsic base region in the first opening.

The method additionally includes the step of forming a sacrificial material on the isolation region over the first intrinsic base region in the first opening. The method further includes the steps of etching the isolation region, and removing the sacrificial material after the isolation region has been etched.

In addition, a base spacer is formed that contacts the extrinsic base and the layer of isolation material formed on the first intrinsic base region, and an emitter spacer is formed that contacts the extrinsic emitter and the layer of isolation material on the first intrinsic base region. The base spacer is spaced apart from the emitter spacer.

The method also includes the step of etching the layer of isolation material to form a gap between the base spacer and the first intrinsic base region, and the emitter spacer and the first intrinsic base region. The method further includes the step of forming a second intrinsic base region to fill up the gap so that the second intrinsic base region contacts the first intrinsic base region, the base spacer, and the emitter spacer.

A better understanding of the features and advantages of the present invention will be obtained by reference to the following detailed description and accompanying drawings that set forth an illustrative embodiment in which the principles of the invention are utilized.

DETAILED DESCRIPTION

Figure 1:
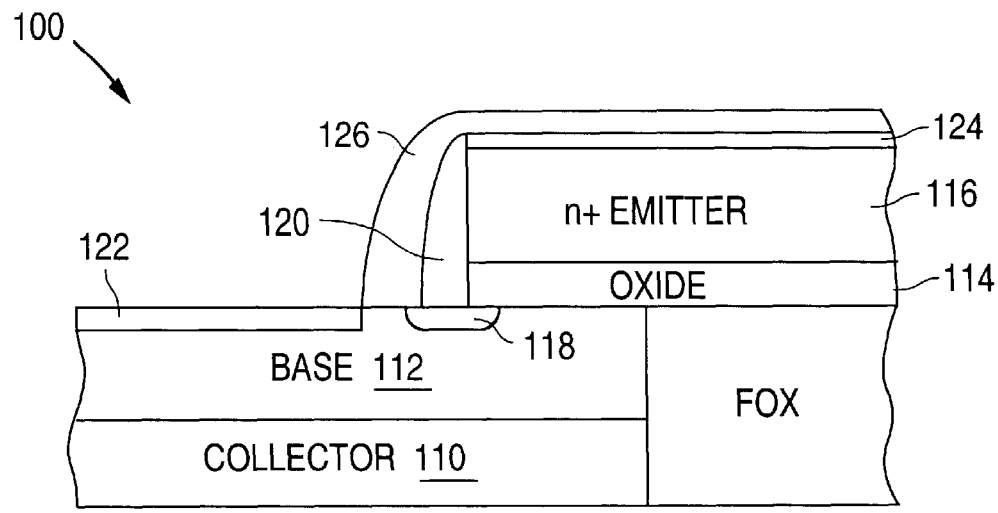
FIG. 1 is a cross-sectional diagram illustrating a portion of a prior-art, low-power high-frequency bipolar transistor 100.
Figure 2:
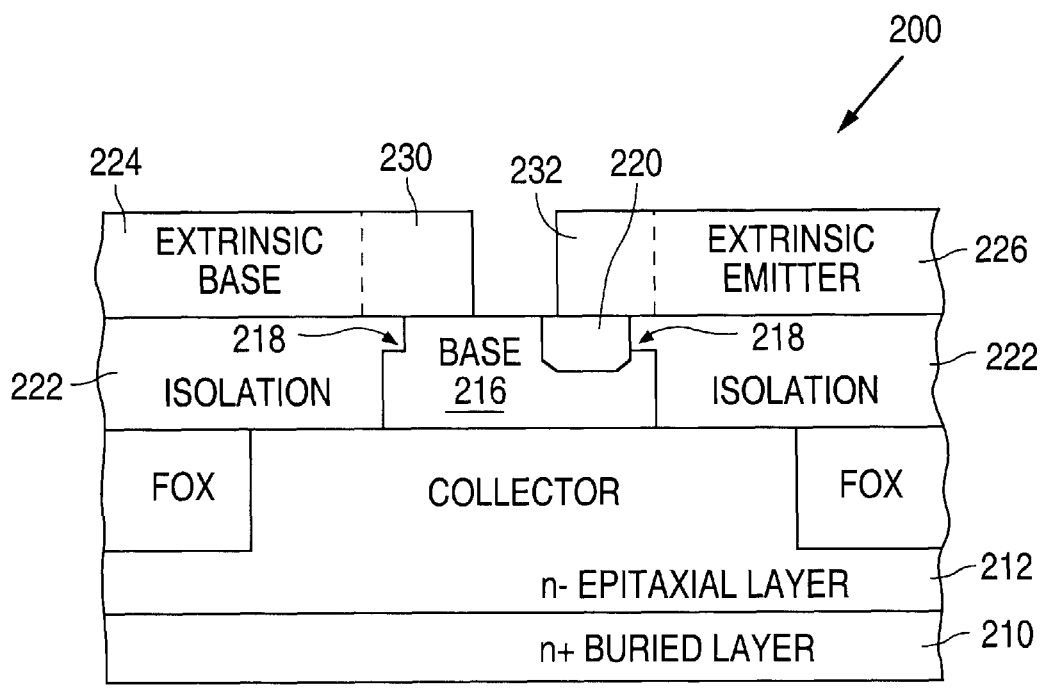
FIG. 2 is a cross-sectional diagram illustrating a portion of a low-power high-frequency bipolar transistor 200 in accordance with the present invention.

FIG. 2 is a cross-sectional diagram that illustrates a portion of a low-power high-frequency bipolar transistor 200 in accordance with the present invention. As shown in FIG. 2, transistor 200 is formed on a wafer that has an n+ buried layer 210, an n− epitaxial layer 212 that is formed over n+ buried layer 210, and a field oxide region FOX that adjoins layer 212. N+ buried layer 210 and n− epitaxial layer 212 form the collector of transistor 200.

As further shown in FIG. 2, transistor 200 includes a p− intrinsic base 216 that is formed on n− epitaxial layer 212. Intrinsic base 216 has side wall surfaces and a substantially planar top surface that is connected to the side wall surfaces via notches 218. In accordance with the present invention, intrinsic base 216 is formed to have a predefined footprint that is at or near the minimum photolithographic limits of the fabrication process. Minimizing the size of base 216 minimizes the base-to-collector contact area which, in turn, reduces the base-to-collector capacitance. For example, using 0.2 um design rules, a base-to-collector area of 0.06 um$^2$ can be achieved.

In addition, transistor 200 includes an n+ intrinsic emitter region 220 that is formed in p− intrinsic base 216, and a layer of isolation material 222 that is formed on n− epitaxial layer 212 to adjoin intrinsic base 216. In addition, isolation material 222 is also formed on notches 218 of base 216.

Transistor 200 further includes an extrinsic base 224 that is formed on isolation layer 222, and a spaced-apart extrinsic emitter 226 that is formed on isolation layer 222. Transistor 200 additionally has a base spacer 230 that is connected to intrinsic base 216 and extrinsic base 224, and a spaced-apart emitter spacer 232 that is connected to intrinsic emitter region 220 and extrinsic emitter 226.

As described in greater detail below, the method of the present invention forms spacers 230 and 232 in a self-aligned process that produces sublithographic feature sizes. This allows emitter region 220 to be very small which, in turn, reduces the base-to-emitter capacitance. Further, the close spacing between the base and emitter spacers 230 and 232 reduces the base resistance. As further described in greater detail below, the method of the present invention also utilizes notches 218 to position emitter region 220 away from the lower junction between intrinsic base 216 and isolation layer 222.

Figure 3A:
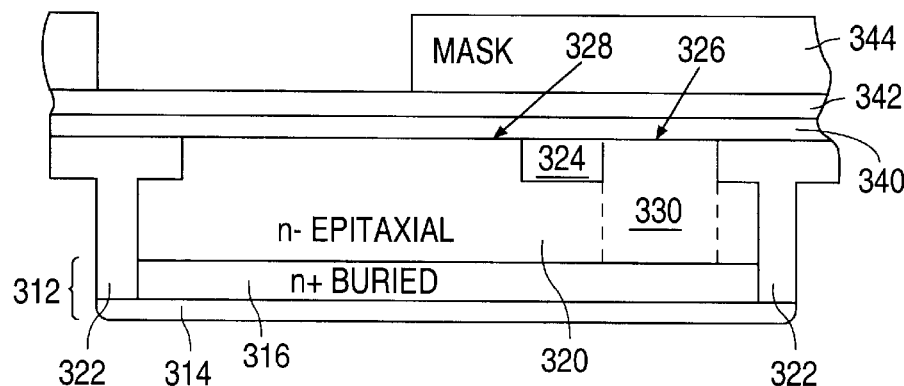
FIGS. 3A–3I are cross-sectional drawings illustrating a method of forming a bipolar transistor in accordance with the present invention.

FIGS. 3A–3I are cross-sectional drawings that illustrate a method of forming bipolar transistor 200 in accordance with the present invention. As shown in FIG. 3A, the method utilizes a conventionally-formed wafer that has a semiconductor layer 312. Semiconductor layer 312, in turn, has a substrate layer 314, such as silicon or oxide, and an n+ buried layer 316. In addition, the wafer also has a lightly-doped, n− type epitaxial layer 320 that is formed on n+ buried layer 316.

The wafer further has a deep trench isolation region 322 that isolates epitaxial layer 320 from laterally adjacent regions. A shallow trench isolation region 324 is also formed in epitaxial layer 320. The shallow trench isolation region 324 separates a collector surface area 326 from a base/emitter surface area 328 of the to-be-formed bipolar transistor.

In addition, the wafer can optionally include an n+ diffused contact region 330 that extends down from collector surface area 326 in epitaxial layer 320 to contact n+ buried layer 316. Contact region 330 is utilized to reduce the series resistance to buried layer 316. N+ buried layer 316, n− epitaxial layer 320, and optional n+ diffused contact region 330 define the collector of the to-be-formed bipolar transistor.

As shown in FIG. 3A, the method of the present invention begins by depositing a layer of oxide 340 approximately 2000 Å thick on the surface of epitaxial layer 320. Following this, a layer of undoped polysilicon (poly) 342 approximately 2000 Å thick is deposited on oxide layer 340. Next, a first poly-doping mask 344 is formed and patterned on poly layer 342.

Mask 344 is patterned to expose an extrinsic emitter region of poly layer 342, and protect an extrinsic base region of poly layer 342. Once mask 344 has been patterned, the exposed regions of poly layer 342 are implanted with a dopant, such as phosphorous or arsenic, to dope the extrinsic emitter region of poly layer 342. For example, phosphorous can be implanted into poly layer 342 at a dose of $1.0 \times 10^{16}$ atoms/cm$^3$ at an implant energy of 30 KeV. Mask 344 is then stripped.

Following this, a second poly-doping mask (not shown) is formed and patterned on poly layer 342. The second poly-doping mask is patterned to protect the extrinsic emitter region of poly layer 342, and expose the extrinsic base region of poly layer 342. Once the second poly-doping mask has been patterned, the exposed regions of poly layer 342 are implanted with boron to dope the extrinsic base region of poly layer 342. For example, boron can be implanted at a dose of $1.0 \times 10^{16}$ atoms/cm$^3$ at an implant energy of 15 KeV. The second poly-doping mask is then stripped.

Figure 3B:
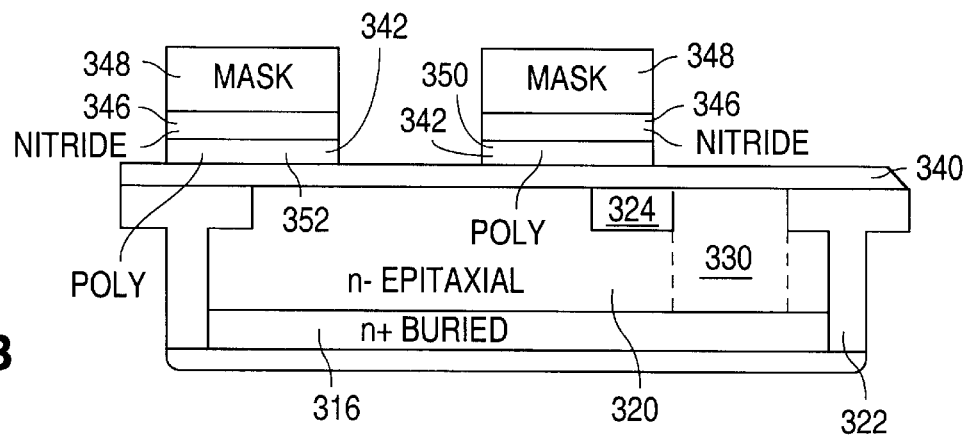

Next, as shown in FIG. 3B, a layer of silicon nitride 346 approximately 450 Å thick is formed on poly layer 342. Following this, a poly etch mask 348 is formed and patterned on poly layer 342. Mask 348 is patterned to define extrinsic base and emitter regions in poly layer 342. Once mask 348 has been patterned, the exposed region of nitride layer 346 and the underlying poly layer 342 are etched and removed. The etch defines an extrinsic base 350 and an extrinsic emitter 352. Mask 348 is then stripped.

Figure 3C:
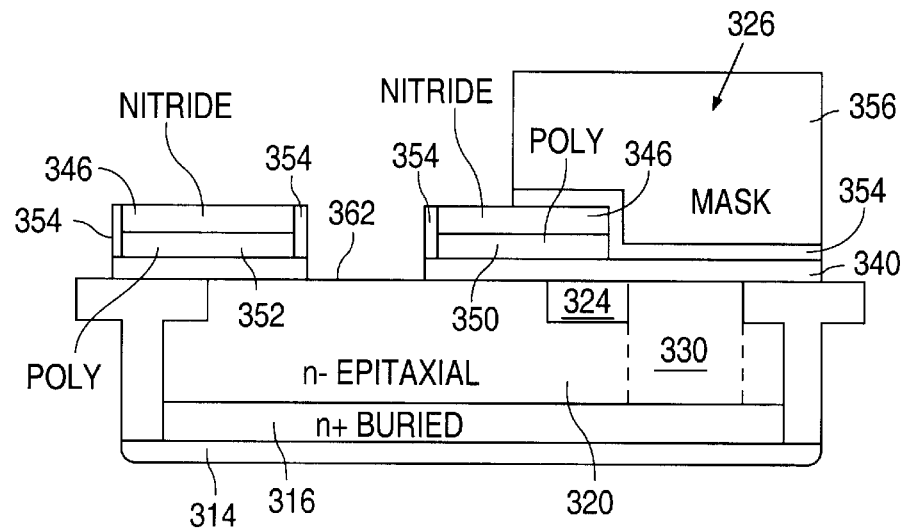

Following this, as shown in FIG. 3C, a layer of silicon nitride 354 approximately 100 Å thick is formed on the exposed surfaces of oxide layer 340, nitride layer 346, and the side wall surfaces of extrinsic base 350 and extrinsic emitter 352. Nitride layers 346 and 354 protect extrinsic base 350 and extrinsic emitter 352 during a subsequent epitaxial growth step. After nitride layer 354 has been formed, an oxide mat definition mask 356 is formed and patterned on nitride layer 354. Mask 356 is patterned to protect collector surface area 326.

Once mask 356 has been patterned, the exposed region of nitride layer 354 is etched until oxide layer 340 is exposed. Following this, the exposed regions of oxide layer 340 are dry etched and removed. The etch forms an opening 360 that exposes a surface region 362 of n– epitaxial layer 320. Opening 360 can be, for example, approximately 0.3 um square. Mask 356 is then stripped.

Figure 3D:
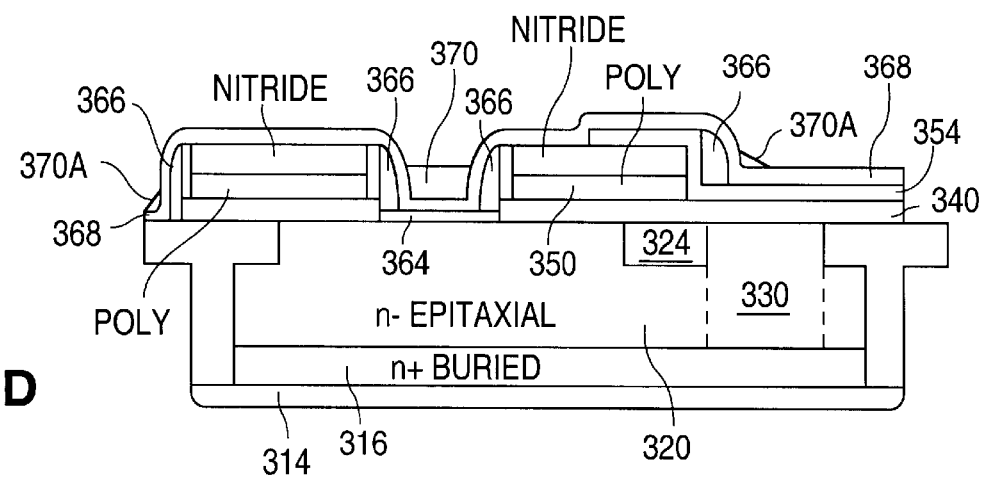

As shown in FIG. 3D, once mask 356 has been stripped, a p– base region 364 approximately 1000 Å thick is formed on n– epitaxial layer 320. P– base region 364 can be formed by growing a p– epitaxial layer using conventional epitaxial preparation and growth steps. Germanium or germanium carbon can be added to the silicon used to epitaxially form base region 364 to enhance the performance of the resulting npn bipolar transistor.

Alternately, rather than forming p– base region 364 by growing a p– epitaxial layer, base region 364 can be formed by implanting boron into n– epitaxial layer 320. Thus, in accordance with the present invention, the size of opening 360 defines the footprint of base region 364. By forming base region 364 to have a small size, the base-to-collector capacitance is reduced.

After p– base region 364 has been formed, a layer of oxide approximately 400Å thick is formed on nitride layer 346, nitride layer 354 and p– base region 364. The oxide layer is then anisotropically etched to form oxide spacers 366. Next, a layer of seal oxide 368 approximately 100 Å thick is formed on nitride layer 354, p– base region 364, and spacers 366.

Following this, a layer of silicon nitride approximately 3000 Å thick is formed on seal oxide layer 368. The layer of silicon nitride is then anisotropically etched to expose the regions of seal oxide layer 368 that lie over oxide spacers 366, form a nitride plug 370 between the extrinsic base and emitter 350 and 352 over base region 364, and nitride stringers 370A.

Figure 3E:
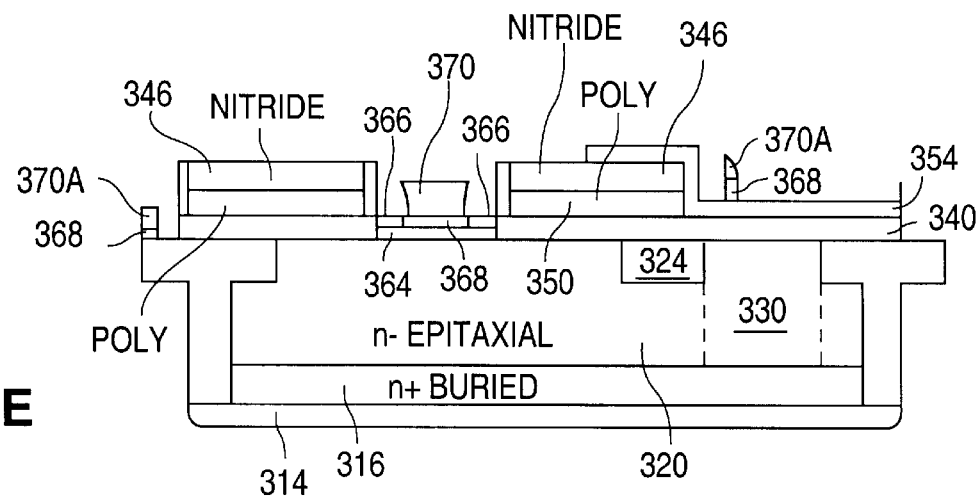

As shown in FIG. 3E, the exposed regions of seal oxide layer 368 and the underlying oxide spacers 366 are then etched until the top surfaces of the oxide spacers 366 in opening 360 are approximately level with the bottom surfaces of extrinsic base 350 and extrinsic emitter 352. (Oxide spacers 366 in opening 360 can be etched a lesser or greater amount to raise or lower the height of the oxide spacers 366.)

In accordance with the present invention, oxide spacers 366 are utilized to position the to-be-formed intrinsic emitter region away from the junction between oxide layer 340 and base region 364. When base region 364 is formed by epitaxial growth, the quality of the epitaxial layer that adjoins oxide layer 340 is typically of poor quality. By positioning the to-be-formed intrinsic emitter region away from the base-to-oxide junction, the influence of the poor quality material is reduced.

The etch removes the seal oxide layer 368 that was formed over extrinsic base 350 and extrinsic emitter 352 and nearly all of collector surface area 326. The etch leaves the seal oxide layer 368 that was formed on base region 364, and the seal oxide layer 368 that was formed below the nitride stringers 370A.

Figure 3F:
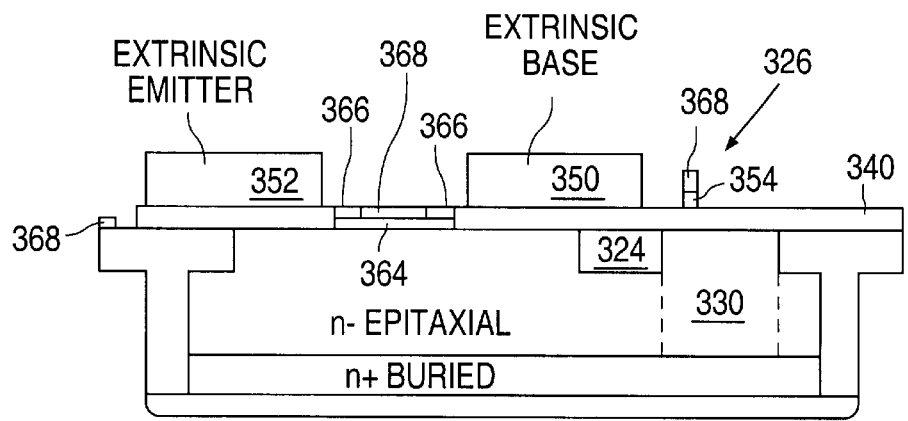

Following this, as shown in FIG. 3F, nitride layer 346, nitride layer 354, nitride plug 370, and nitride stringers 370A are etched away. The etch exposes all of the seal oxide layer 368 that was formed over base region 364, and the portions of seal oxide layer 368 that were formed under nitride stringers 370A.

As further shown in FIG. 3F, a portion of nitride layer 354 will be left under the oxide 368 that was under the stringer 370A formed over collector surface area 326 if the nitride layers are anisotropically etched. If wet etched were layer 354 is totally removed, then the oxide 368 that was under stringer 370A may become debris to be removed from the wafer.

Figure 3G:
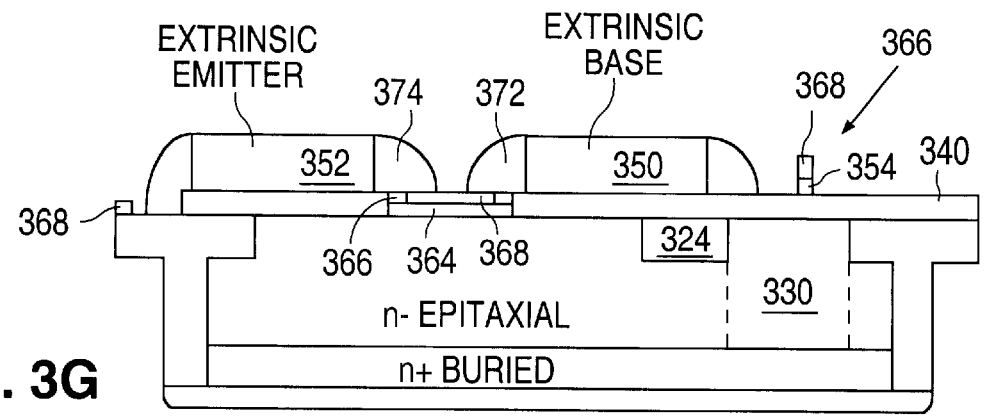

As shown in FIG. 3G, an undoped layer of poly is next deposited on extrinsic base 350, extrinsic emitter 352, and the exposed regions of oxide layers 340 and 368 and spacers 366. The undoped layer of poly is then anisotropically etched to form a base poly spacer 372 that is connected to extrinsic base 350 and seal oxide layer 368 (over p– base region 364), and an emitter poly spacer 374 that is connected to extrinsic emitter 352 and seal oxide layer 368 (over p– base region 364). Spacers 372 and 374 are formed to have a thickness of approximately 1000Å.

Figure 3H:
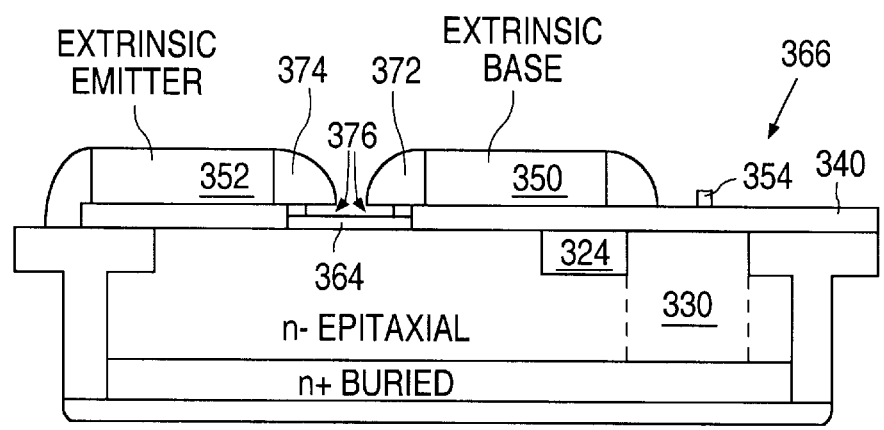
Figure 3I:
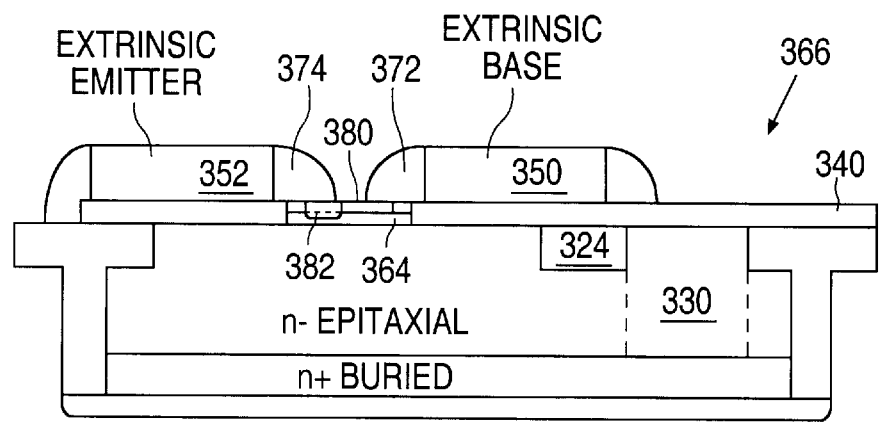

Following this, as shown in FIG. 3H, seal oxide layer 368 is etched away using a wet etch to form a gap 376. Next, as shown in FIG. 3I, a p– epitaxial layer 380 approximately 100 Å thick is grown on p– base region 364 using conventional epitaxial preparation and growth steps to fill up gap 376 between base region 364, and spacers 372 and 374. (As above, germanium or germanium carbon can be added to the silicon used to epitaxially form layer 380 to enhance the performance of the resulting npn bipolar transistor.) Thus, in the present invention, the base of transistor 200 is formed from the combination of base region 364 and epitaxial layer 380.

Following the formation of epitaxial layer 380, the wafer is subject to rapid thermal annealing (RTA). During the RTA process, dopants from extrinsic base 350 diffuse into base poly spacer 372, p– pitaxial layer 380, and p– base region 364 to form a contact region in base region 364. At the same time, dopants from extrinsic emitter 352 diffuse into emitter poly spacer 374, epitaxial layer 380, and p– base region 364 to form a n+ emitter region 382 in layer 364. (Although very little diffusion takes place in single-crystal silicon during an RTA process, significant diffusion takes place in polysilicon.) The method then continues with conventional steps.

Thus, a method for forming a bipolar transistor in accordance with the present invention has been described. The present method forms a small base region, an extrinsic base and emitter that are formed over an oxide, and small, self-aligned base and emitter contacts. As a result, the present method produces a bipolar transistor that reduces the base-to-collector and base-to-emitter capacitances.

It should be understood that various alternatives to the method of the invention described herein may be employed in practicing the invention. For example, although the method is described with respect to npn transistors, the method applies equally well to pnp transistors where the conductivity types are reversed.

In addition, the present method can be incorporated into a BiCMOS process. Thus, it is intended that the following claims define the scope of the invention and that methods and structures within the scope of these claims and their equivalents be covered thereby.

What is claimed is:

1. A bipolar transistor formed on a wafer, the wafer having a buried layer and a first epitaxial layer of a first conductivity type, the first epitaxial layer being formed over the buried layer and having a surface and a smaller dopant concentration than the buried layer, the transistor comprising:

an intrinsic base region of a second conductivity type formed on the first epitaxial layer, the intrinsic base region having a first side wall, a second side wall, and a top surface connected to the first side wall via a first notch and to the second side wall via a second notch;

a layer of isolation material formed on the first epitaxial layer, the layer of isolation material contacting the first side wall and the second side wall of the intrinsic base region, and being formed over the first notch and the second notch;

an intrinsic emitter region formed in the intrinsic base region;

an extrinsic base formed on the layer of isolation material;

an extrinsic emitter formed on the layer of isolation material;

a conductive base spacer connected to the extrinsic base and the intrinsic base region, the conductive base spacer being formed over the first notch; and a conductive emitter spacer connected to the extrinsic emitter and the intrinsic base region, the conductive emitter spacer being formed over the second notch.

2. The bipolar transistor of claim 1, wherein the intrinsic base region includes:

a second epitaxial layer formed on the first epitaxial layer; and a third epitaxial layer formed on the second epitaxial layer, the intrinsic emitter region being formed in the second and third epitaxial layers.

\* \* \* \* \*

UNITED STATES PATENT AND TRADEMARK OFFICE
CERTIFICATE OF CORRECTION

PATENT NO. : 6,603,188 B1  Page 1 of 1
DATED : August 5, 2003
INVENTOR(S) : Darwish et al.

It is certified that error appears in the above-identified patent and that said Letters Patent is hereby corrected as shown below:

Title page,
Item [56], OTHER PUBLICATIONS, delete "Wilm van der Wel et al., "Pol y-Ridge Emitter Transistor (PRET): Simple Low-Power Option to a Bipolar Process", IEDM, 1993, pps. 453-456." and replace with -- "Wim van der Wel et al., "Poly-Ridge Emitter Transistor (PRET): Simple Low-Power Option to a Bipolar Process", IEDM, 1993, pps. 453-456. --

Column 5,
Line 21, delete "400A" and replace with -- 400 Å --.
Line 67, delete "350,." and replace with -- 350, --.

Column 8,
Line 1, delete "1," and replace with -- 1 --.

Signed and Sealed this

Eleventh Day of November, 2003

JAMES E. ROGAN
*Director of the United States Patent and Trademark Office*